United States Patent [19]

Harari

[11] 4,072,976

[45] Feb. 7, 1978

[54] GATE PROTECTION DEVICE FOR MOS CIRCUITS

[75] Inventor: Eliyahou Harari, Irvine, Calif.

[73] Assignee: Hughes Aircraft Company, Culver City, Calif.

[21] Appl. No.: 754,932

[22] Filed: Dec. 28, 1976

[51] Int. Cl.$^2$ .................... H01L 29/78; H01L 27/02
[52] U.S. Cl. ........................................ 357/23; 357/51; 361/273; 361/275
[58] Field of Search ............... 357/23, 51; 361/273, 361/275

[56] References Cited

U.S. PATENT DOCUMENTS

| | | | |
|---|---|---|---|
| 3,387,286 | 6/1968 | Dennard | 357/23 |
| 3,403,270 | 9/1968 | Pace et al. | 357/23 |
| 3,413,497 | 11/1968 | Atalla | 357/23 |
| 3,423,606 | 1/1969 | Wanlass | 357/23 |
| 3,623,217 | 11/1971 | Kawagoe | 357/23 |
| 3,787,717 | 1/1974 | Fischer | 357/23 |

OTHER PUBLICATIONS

IBM Technical Disclosure Bulletin; by Fischer et al., vol. 13, No. 5, Oct. 1970, pp. 1272 and 1273.

Primary Examiner—Andrew J. James
Attorney, Agent, or Firm—George Tacticos; W. H. MacAllister

[57] ABSTRACT

The specification describes an integrated device for the input protection of MOS circuits. It consists of an MOS capacitor formed by the thinning of a section of the input gate dielectric, SiO$_2$, and the thinning of an adjoining section of the gate metal, Al. An incoming pulse of static charge with high amplitude and short duration will break down the thinned dielectric of the capacitor before breaking down the relatively thick portion of the gate dielectric. Since the metal over the thin dielectric is also relatively thin, it evaporates from the vicinity of the fault by the generated Joule heat immediately following the breakdown. Thus, the breakdown is self healed and can be repeated many times without damaging the circuit.

6 Claims, 5 Drawing Figures

GATE PROTECTION DEVICE FOR MOS CIRCUITS

FIELD OF THE INVENTION

This invention relates generally to a semiconductor device and more particularly to a gate protection device for metal oxide semiconductors (MOS's).

BACKGROUND

In general, MOS devices have a very high input impedance which makes them sensitive to accumulation of static charges. This usually occurs from the mishandling of devices during processing, assembly or test. Such an accumulation of charges can cause a rupture of the gate dielectric which typically has a breakdown voltage of 50 to 100 volts. Such a rupture causes a short circuit between the surface metallization and the substrate material. To prevent such failures there is a need for effective protective devices at all MOS array inputs. There is a variety of such protection devices in use, such as Zener diodes, forward biased diodes, and MOS transistors. Descriptions of such devices and their operation can be found in many standard textbooks on MOS circuits, such as, for example, in "MOS Integrated Circuits" by the Engineering Staff of American Micro-Systems, Inc., published by Van Nostrand Reinhold Company in 1972. The addition of such devices at the MOS inputs tends to lower somewhat the normally high input resistance of the circuit and thus provide for current leakage that is undesirable for many applications that use MOS devices, especially for their high input resistance. Furthermore, such prior art protective devices have an additional disadvantage of being able to handle only a limited amount of current. An additional disadvantage of using such devices is that they can only handle pulses whose rise time is slower than their own turn-on speed.

SUMMARY OF THE INVENTION

The general purpose of this invention is to provide a new and improved input protection device for MOS circuits, having most, if not all, of the advantages of similarly employed devices while eliminating many of the aforementioned disadvantages.

To accomplish this purpose, I have provided an improved MOS structure having at least one field effect transistor with source, channel and drain regions formed in a semiconductor substrate, a metallic gate electrode, a gate dielectric layer to insulate the gate electrode from the source, gate and drain regions, and source and drain electrodes connected to the source an drain regions, respectively, through ohmic connections. The improvement is embodied in that portion of the MOS structure which includes a selected section of the gate dielectric which is relatively thin with respect to the remaining portion of the dielectric layer and a selected portion of the metallic gate electrode which is relatively thin with respect to the remaining portion of the gate electrode and overlies the relatively thin section of the gate dielectric. When a voltage pulse of excessive amplitude is applied to the gate electrode it will cause a rupture in the thin dielectric region since the electric field in this region is the highest and thereafter a part of the relatively thin portion of the gate electrode will cause a temporary electrical short circuit between the gate electrode and the semiconductor substrate. The Joule heat produced in the vicinity of the ruptured dielectric removes the metal from the point of rupture and eliminates the short circuit.

Such a device at the input of an MOS structure operates like an MOS capacitor absorbing spurious high voltage pulses that would otherwise cause a permanent breakdown in the gate dielectric of the device. When a high voltage pulse reaches an MOS input constructed in accordance with the present invention, it will cause a breakdown in the thin dielectric layer. This breakdown will force the thin gate metal to short the gate to the substrate. However, this short will shortly thereafter heal itself because the heat generated by the short in the vicinity of the breakdown is sufficient to make the metal causing the short to evaporate. The structure is then fully operational again with its input protection device in a position to once again absorb the impact of spurious high voltage pulses before they damage the gate dielectric of the transistors. The same process of breakdown and self-healing can be repeated many times until there is no more thin dielectric left to absorb the impact of a pulse. This gate protection scheme is equally effective with any conducting material used for the gate electrode so long as electrical contact is established between this material and between the thin metal overlapping the area of the thinned oxide.

One advantage of this MOS input protection structure is that it can protect the MOS circuits from any transient pulse which would otherwise cause a breakdown of the active device gate dielectric. This is due to the fact that it permits the pulse to cause an actual oxide breakdown while ensuring that the breakdown takes place in a predetermined location which is quickly self healed by the evaporation of the metal. In applications where the active channel area of the circuit's input transistors is sufficiently large, this input protecting device can be incorporated within the active transistor channel area by selectively thinning a portion of the gate oxide.

Another advantage is that when the input signal is insufficient to cause a breakdown, this input protection device causes a very low current leakage, typically on the order of $10^{-14}$ amps/cm$^2$. This is primarily due to the excellent insulating properties of the thermally grown SiO$_2$.

A further advantage is that it operates equally well for positive and negative pulses and, therefore, greatly simplifies circuit design.

A still further advantage is that it requires a relatively small area of the substrate in comparison with prior art devices.

Another advantage is that it can protect small geometry devices with relatively thin gate dielectric that breaks down at voltages lower than the threshold voltage of a typical prior art input protection diode. For instance, many small geometry devices have gate dielectrics with a typical thickness in the range between 250 to 350 A rather than the more conventional 1000 A dielectrics. For these devices the gate dielectric breaks down at a lower voltage than what is required to turn on a typical input protection diode.

Another advangtage is that is can be used as extra protection in parallel with any of the prior art input protection structures. In this arrangement my device would be particularly useful in absorbing the impact of fast transients for which the adjoining prior art protection device is too slow to react.

Accordingly, it is an object of this invention to provide an MOS structure with an improved input protection device.

It is another object of this invention to provide an input protection device that can be used to protect the MOS circuit from spurious high speed and high voltage pulses.

It is another object of this invention to provide an MOS input protection structure that relies on actual dielectric breakdowns and temporary shorts which are self healing so the structure can be used many times in protecting the circuits.

It is another object of this invention to provide an input protection device that has a low current leakage.

It is another object of this invention to provide an input protection device that works equally well for positive and negative pulses.

It is still another object of this invention to provide an MOS input protection device that can be built with conventional processing steps, takes a very small area of the substrate and uses relatively thin dielectric layers.

A feature of this invention is the provision of an MOS input protection device that can be used in conjunction with prior art devices for optimum circuit protection.

These, and other objects and features of the invention, will become more readily apparent in the following description taken in conjunction with the accompanying drawings.

DETAILED DESCRIPTION

Figure 1:
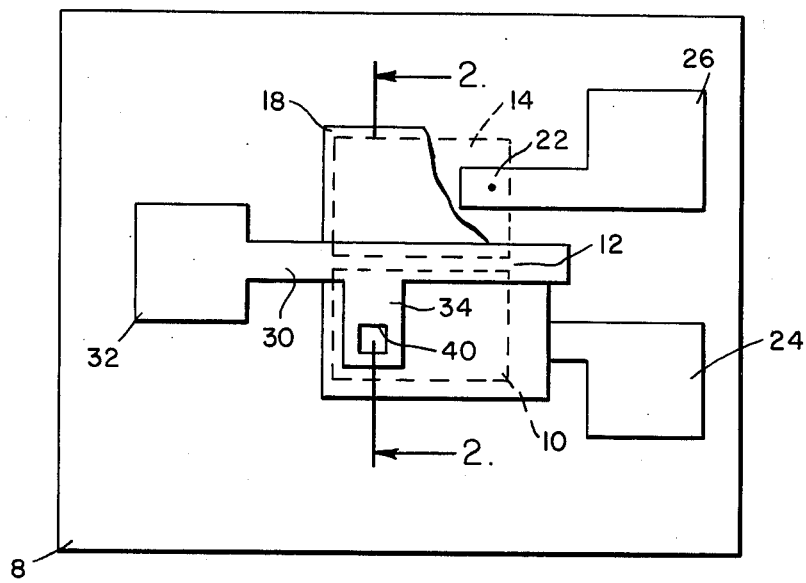
FIG. 1 illustrates a top view of an MOS structure embodying the present invention.

Referring now to FIG. 1, there is shown a top view of an MOS structure constructed in accordance with the present invention. It includes a semi-insulating semiconductor substrate 8 on which there is an active field effect transistor portion including a source region 10, a channel region 12 and a drain region 14. A gate dielectric layer 18 is adjacent the active portion of the transistor, and on the top of this gate dielectric overlying the gate region there is a metallic gate electrode 30 that is connected to a gate pad 32. This metallic gate has an extension 34 where the metal is thinner than the other portion of the metallic trace. This section 34 is overlying a section 40 of the gate dielectric. This section 40 is also relatively thin with respect to the remaining dielectric layer. There is also shown a source bonding pad 24 which is connected to the source region through an ohmic contact and a drain bonding pad 26 which is connected to the drain region through an ohmic contact 22.

Figure 2:
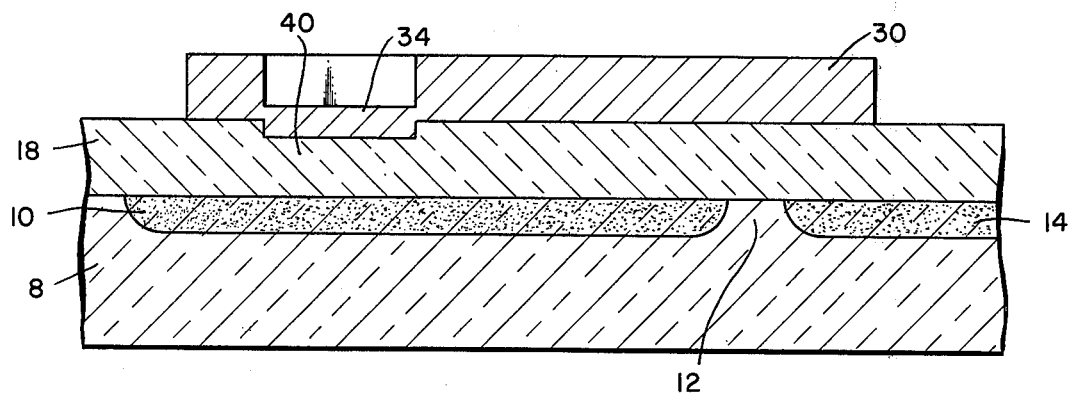
FIG. 2 is a diagrammatic cross-sectional view of a portion of the structure depicted in FIG. 1.

Referring now to FIG. 2, there is shown a magnified cross-sectional view of a portion of the structure shown in FIG. 1. This portion includes the device region where the dielectric layer 18 becomes thinner at a section referred to as 40 in FIG. 1. There is also shown the gate electrode 30 which is adjacent to dielectric layer 18. This metallic electrode has a relatively thin portion 34 that is spatially disposed over the thin dielectric section 40. The device shown in FIG. 2 is basically a simple MOS capacitor, with the metal connected to the input gate which is to be protected, and the substrate being part of the $V_{ss}$ (or source) line running throughout the circuit. There are, however, two distinguishing characteristics to this capacitor. First, the dielectric of this capacitor is thinner than the gate dielectric of all other devices in the structure. This is achieved by growing the capacitor dielectric at the same time with the gate dielectric and then etching away a predetermined portion of the dielectric from the area where the protection device is to be formed. The difference in the thickness of the two dielectrics is established to assure that when a high voltage pulse reaches the input gate of the structure, it will break down the dielectric of the protective device before it breaks down the dielectric of any other device in the chip. The second characteristic is in the thickness of the metallization. The metal of the protection device must be thinner than the metallic traces elsewhere on the device. The metal over the thin dielectric must be thin enough so that when a voltage pulse forces a localized breakdown in a spot of the thin dielectric, the overlying metal which will initially cause a short circuit with the substrate, will evaporate soon afterwards from the heat of the breakdown, thus interrupting the short circuit.

In an exemplary device the substrate was silicon and the dielectric silicon dioxide ($SiO_2$). After all diffusion steps and the thermal oxidation for the $SiO_2$ formation, a thick aluminum (Al) layer was deposited over the oxidized wafer surface. The Al was then masked to open up areas for the gate protection devices. After etching the Al from these areas the remaining Al and photoresist were used as a mask for a one to three minutes oxide etch in 30:1 solution of $H_2O$:HF. This removed 100 to 300 A of the oxide which was initially approximately 1000 A. The photoresist was then removed and a thin Al layer with an approximate thickness of 1000 A was deposited elsewhere. Both layers of metal were then masked and etched using a conventional process. The same effect could be achieved if the first metalization layer was composed of doped polysilicon, with the second etching performed first through the thin Al and then through the polysilicon underneath it.

Figure 3:
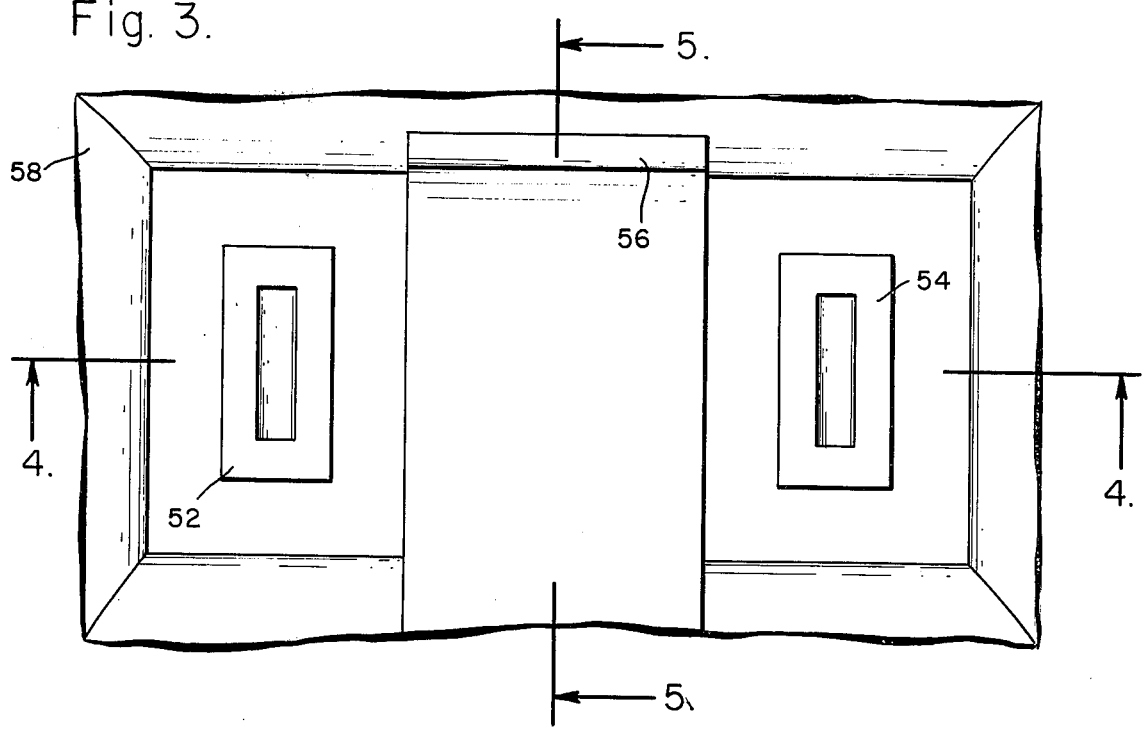
FIG. 3 is a top view of another embodiment of the present invention.

Referring now to FIG. 3, there is shown another embodiment of the present invention wherein the input protection device is in the channel region of the transistor. The device shown in FIG. 3 includes an MOS active transistor portion covered by a dielectric layer 50 with source and drain ohmic contacts 52 and 54, respectively. A gate electrode 56 overlies the channel region and parts of the source and drain regions and is insulated from the source, channel and drain regions by the dielectric region 50. The active transistor region is surrounded by a relatively thick field oxide layer 58.

Figure 4:
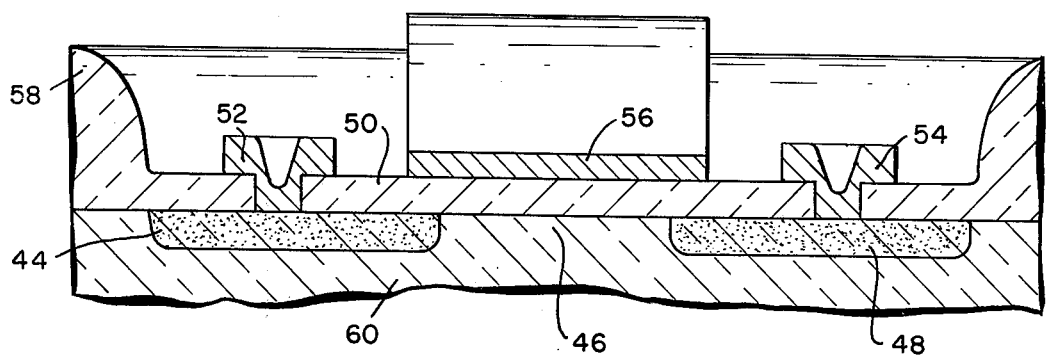
FIG. 4 is a cross-sectional view of the structure shown in FIG. 3.

Referring now to FIG. 4, there is shown a cross-sectional view of the structure shown in FIG. 3, along the line 4—4. It shows a cross-sectional view of the active transistor portion including a semi-insulating substrate 60, the transistor regions 44, 46 and 48 for the source, channel and drain regions respectively, a gate dielectric layer 50, ohmic contacts 52 and 54 for the source and drain regions respectively, a gate electrode 56 and an isolation field oxide 58.

Figure 5:
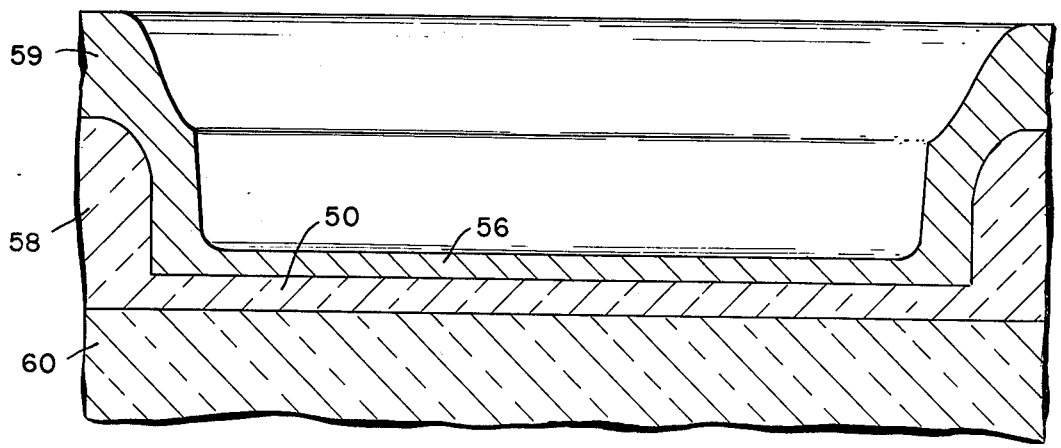
FIG. 5 is another cross-sectional view of the structure shown in FIG. 3.

Referring now to FIG. 5, there is shown another cross-sectional view of the structure shown in FIG. 3 along the line 5—5. It shows a cross-sectional view of the transistor channel region including the semi-insulating substrate 60, the gate dielectric 50 and the gate electrode 56. The gate oxide 50 extends beyond the transistor channel region and into the field oxide layer 58 which is relatively thick with respect to the gate oxide 50. Similarly, the gate electrode 56 extends over the field oxide and becomes a metallic trace 59 that terminates over a predetermined bonding pad. The operation of this device is similar to the operation of the device shown in FIG. 1 which was described in an earlier section of the specification. The major difference between the two is that the device of FIG. 3 does not have a special region for the input protection structure outside the channel of the transistor. Instead, the whole channel region is especially made to act as an input protection structure. The oxide (typically $SiO_2$) is thinned relative to the field oxide and the metallic gate (typically Al) is also thinned so that a breakdown over the channel region will be self-healed by the evaporation of the metal. This embodiment is preferred in applications where the active channel region of the input transistors is sufficiently large so that even after a number of self-healed breakdowns there is enough channel area left to permit the transistor to operate substantially unaffected by the damage. For many MOS circuits the gate dielectric is sufficiently thin in comparison with the relatively thick field oxide so that there is no need to etch any portion of the original gate dielectric formed over the channel region of the transistor. The metal of the gate electrode has to be made thinner than the remaining metal traces of the structure so that when an oxide breakdown occurs over the channel region, the metal that shorts the gate electrode to the substrate evaporates from the heat and the breakdown heals itself. The metal over the channel region can be made very thin without adversely affecting the operation of the transistor because the gate electrode of an input transistor carries a relatively small amount of current. However, the remaining metallic interconnects have to be substantially thicker in order to be able to carry more current and to be able to provide reliable electrical interconnections over the various oxide steps of the structure. Even the gate metal has to step up in thickness in the vicinity of the field oxide step in order to provide an adequate and reliable step coverage.

This invention relies on the self-healing properties of dielectric films. A good reference on studies of the dielectric breakdown of $SiO_2$ films can be found in an article entitled, "A Study of the Dielectric Breakdown of Thermally Grown $SiO_2$ by the Self-Quenching Technique" and published in the "13th Annual Proceedings of Reliability Physics"[IEEE] page 10 (1975). It is known, that the breakdown of thermal oxides always occurs in very localized regions. The current density through the oxide in that region is high enough to cause local heating and if the aluminum layer over the breakdown spot is sufficiently thin (approximately 1000 A), the heat will evaporate the aluminum in the vicinity of the breakdown spot. Typically, the size of the evaporated aluminum is around 0.2 mil in diameter. This is enough to break the electrical contact between the gate electrode and the substrate. The total area of the electrode is only slightly reduced by this evaporation and the breakdown is effectively removed from the MOS capacitor. Thus, this MOS capacitor with the thin aluminum can undergo as many self-healing breakdowns as there is remaining area of thin aluminum and the remaining capacitor structure shows no measurable degradation.

What is claimed is:

1. In an improved MOS device of the type having at least one field effect transistor with source, channel and drain regions formed in a semiconductor substrate, a metallic gate electrode and a gate dielectric layer which insulates said gate electrode from said source, gate and drain regions, source and drain electrodes connected to said source and drain regions respectively through ohmic connections, the improvement which comprises:
   a. a predetermined section of said gate dielectric which is relatively thin with respect to the remaining portion of said dielectric layer;
   b. a predetermined portion of said metallic gate electrode which is relatively thin with respect to the remaining portion of said gate electrode and is adjoining said relatively thin section of said gate dielectric whereby when an excessive voltage pulse is applied on said gate electrode it will cause a rupture in said thin dielectric region and a part of the metal of said relatively thin portion of said gate electrode will cause a temporary electrical short circuit between said gate electrode and said semiconductor substrate and said Joule heat produced in the vicinity removes said metal from said point of rupture and thus said short circuit is eliminated.

2. A device as set forth in claim 1 wherein:
   a. said semiconductor substrate is silicon;
   b. said gate electrode is silicon dioxide;
   c. said gate electrode is aluminum.

3. A device as set forth in claim 1 wherein:
   a. said relatively thin section of said gate dielectric is in the range of 50 A to 300 A thinner than the remaining portion of said gate dielectric;
   b. said relatively thin portion of said gate electrode has a thickness in the range of 200 to 2000 A.

4. In an improved MOS structure having an array of field effect devices each comprising source, gate and drain regions, formed in a semiconductor substrate, a gate dielectric layer, a metallic gate electrode, ohmic connections for said source and drain regions wherein said gate electrode is used as an input terminal for said MOS structure and wherein each such input is protected by an input protection device, the improvement which comprises:
   a. a predetermined portion of said gate dielectric lying under a portion of a metallic trace connected with said gate electrode, is relatively thin with respect to the remaining portion of said dielectric layer;
   b. a portion of said metallic trace connected with said gate electrode that lies over said thin gate dielectric portion is relatively thin whereby a spurious high voltage pulse causes a localized breakdown in a section of said thin dielectric portion causing metal from said metallic trace in the vicinity of the breakdown to establish a temporary short circuit between said gate electrode and said substrate which short circuit is interrupted by the subsequent evaporation of said metal by the heat generated by the breakdown of the dielectric.

5. A device for protecting the input gate of an MOS structure comprising:
   a. a semiconductor substrate on which active regions for said MOS structure are formed including source, channel and drain regions;

b. a gate dielectric region of predetermined thickness adjacent to said active regions of said substrate;

c. a metallic gate electrode of predetermined thickness adjacent a portion of said gate dielectric region and spatially disposed over said channel region and parts of said source and drain regions whereby the thickness of said metallic gate electrode is selected so that when a spurious voltage pulse reaches said gate electrode and causes a rupture in a portion of said gate dielectric and the metal from the vicinity of said rupture is forced to pass through said rupture and electrically short said substrate to said gate electrode, said metal will be sufficiently thin to evaporate from the generated heat and interrupt said electrical short.

6. A process for diverting spurious high currents from active and passive MOS devices which form MOS integrated circuits, said process including:

a. providing selected overlying regions of metal and dielectric material which extend from and are equipotential with the metal and dielectric layers which form part of said MOS devices; and b. limiting the thickness of said selected metal and dielectric regions to values which are less than the respective thicknesses of the remaining extending metal and dielectric layers by predetermined amounts sufficient to produce rupture of the selected dielectric region when exposed to a spurious voltage spike and also sufficient to evaporate by Joule heat a portion of said selected metal region when the latter is shorted through the ruptured dielectric region to an underlying substrate, whereby the evaporation of said selected metal region removes the short therethrough and prepares said MOS integrated circuits for their intended operation.

* * * * *